US011387718B2

(12) United States Patent
Shirai et al.

(10) Patent No.: US 11,387,718 B2
(45) Date of Patent: Jul. 12, 2022

(54) METHOD OF REMOVING COATING LAYER OF COIL WIRING

(71) Applicants: TOYOTA JIDOSHA KABUSHIKI KAISHA, Toyota (JP); DENSO CORPORATION, Kariya (JP)

(72) Inventors: Ken Shirai, Miyoshi (JP); Yasuyuki Hirao, Okazaki (JP); Masashi Matsumoto, Nagoya (JP); Hiroaki Takeda, Kariya (JP); Ryosuke Maruyama, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 400 days.

(21) Appl. No.: 16/580,391

(22) Filed: Sep. 24, 2019

(65) Prior Publication Data

US 2020/0106347 A1      Apr. 2, 2020

(30) Foreign Application Priority Data

Sep. 27, 2018   (JP) .............................. JP2018-182788

(51) Int. Cl.
*H02K 15/00*       (2006.01)
*H01F 41/12*       (2006.01)
(Continued)

(52) U.S. Cl.
CPC ....... *H02K 15/0006* (2013.01); *B23K 26/142* (2015.10); *B23K 26/16* (2013.01);
(Continued)

(58) Field of Classification Search
CPC ........ H01F 41/10; H01F 41/12; H01F 41/122; H01F 41/125; B23K 26/142; B23K 26/16;
(Continued)

(56) References Cited

U.S. PATENT DOCUMENTS

2005/0106903 A1*   5/2005   Tamagawa ............. H05K 1/118
                                                                    439/67

FOREIGN PATENT DOCUMENTS

JP         2000-023428 A      1/2000
JP         2009-16502 A       1/2009
(Continued)

OTHER PUBLICATIONS

Yamaguchi, K., Development of LCR Laser Function Trimming Unit, IEEE Proceedings, Dec. 1995, pp. 283-286. (Year: 1995).*

*Primary Examiner* — A. Dexter Tugbang
(74) *Attorney, Agent, or Firm* — Sughrue Mion, PLLC (57) ABSTRACT

A method of removing an insulating coating layer of coil wiring includes: a fragmentation step in which a line-shaped region of the insulating coating layer, which separates a removal-planned portion and a remain-planned portion of the insulating coating layer, is removed; a laser irradiation step in which laser light which transmits through the insulating coating layer but which is absorbed by a coil wiring is irradiated from a side of an outer surface of the removal-planned portion toward a boundary of the coil wiring with the insulating coating layer, to carbonize a boundary portion between the insulating coating layer and the coil wiring of the removal-planned portion by generation of heat of the coil wiring; and a coating turn-over step in which air is blown onto the removal-planned portion to turn over and blow off the removal-planned portion.

6 Claims, 6 Drawing Sheets

(51) Int. Cl.
    *B23K 26/16*           (2006.01)
    *B23K 26/142*        (2014.01)
    *B23K 26/359*        (2014.01)
    *B23K 101/38*        (2006.01)
    *B23K 101/42*        (2006.01)
    *H05K 1/11*           (2006.01)
    *H01F 41/10*         (2006.01)

(52) U.S. Cl.
    CPC ........... *B23K 26/359* (2015.10); *H01F 41/12* (2013.01); *B23K 2101/38* (2018.08); *B23K 2101/42* (2018.08); *H01F 41/10* (2013.01); *H01F 41/122* (2013.01); *H01F 41/125* (2013.01); *H05K 1/118* (2013.01)

(58) Field of Classification Search
    CPC .............. B23K 26/359; B23K 2101/38; B23K 2101/42; H05K 1/118; H02K 15/0006
    See application file for complete search history.

(56) References Cited

FOREIGN PATENT DOCUMENTS

| | | | | |
|---|---|---|---|---|
| JP | 2009-80294 A | | 4/2009 | |
| JP | 2011255407 A | * | 12/2011 | ........... B23K 26/364 |
| JP | 2017199724 A | * | 11/2017 | |
| JP | 2017-220634 A | | 12/2017 | |
| JP | 2019-136758 A | | 8/2019 | |

* cited by examiner

METHOD OF REMOVING COATING LAYER OF COIL WIRING

CROSS REFERENCE TO RELATED APPLICATION

This application claims priority to Japanese Patent Application No. 2018-182788 filed on Sep. 27, 2018, which is incorporated herein by reference in its entirety including the specification, claims, drawings, and abstract.

TECHNICAL FIELD

The present disclosure relates to a method of removing an insulating coating layer which is in close contact with a coil wiring.

BACKGROUND

JP 2000-23428 A discloses a method of removing an insulating coating layer which is in close contact with a coil wiring, by irradiating laser light onto the insulating coating layer. With this method, the removal of the insulating coating layer can be accurately and quickly executed by suitably managing an irradiation region of the laser light.

In the method of JP 2000-23428 A, in order to remove the insulating coating layer, it is necessary to carbonize and sublime, with the laser light, all of the regions (all volume) including an outer surface side portion of a portion to be removed. Thus, the laser irradiation time is elongated. Because the laser irradiation time may account for a large percentage of a total removal work time of the insulating coating layer, shortening the laser irradiation time is desired.

The present disclosure relates to a method of shortening a laser irradiation time in a removal work of an insulating coating layer which is in close contact with a coil wiring.

SUMMARY

According to one aspect of the present disclosure, there is provided a method of removing an insulating coating layer which is in close contact with a coil wiring, comprising: a fragmentation step in which a line-shaped region of the insulating coating layer, which separates a removal-planned portion and a remain-planned portion of the insulating coating layer, is removed; a laser irradiation step in which laser light which transmits through the insulating coating layer but which is absorbed by the coil wiring is irradiated from a side of an outer surface of the removal-planned portion toward a boundary of the coil wiring with the insulating coating layer, to carbonize a boundary portion between the insulating coating layer and the coil wiring of the removal-planned portion, by generation of heat of the coil wiring; and a coating turn-over step in which air is blown onto the removal-planned portion to turn over and blow off the removal-planned portion. Alternatively, the laser irradiation step and the application of the air blow to the removal-planned portion in the coating turn-over step may be executed simultaneously.

With the above-described structure, because the boundary portion between the insulating coating layer and the coil wiring of the removal-planned portion is carbonized by laser irradiation in the laser irradiation step, a degree of contact of the boundary portion with respect to the coil wiring can be reduced. In the coating turn-over step, because air is blown onto the removal-planned portion, to turn over and blow off the removal-planned portion, the removal-planned portion can be removed without requiring carbonization of all (all volume) of the removal-planned portion, by the laser irradiation. With this configuration, the laser irradiation time in the removal work of the insulating coating layer can be shortened.

According to the method of removing the coating layer of the coil wiring of the present disclosure, the laser irradiation time in the removal work of the insulating coating layer can be shortened.

BRIEF DESCRIPTION OF DRAWINGS

Embodiment(s) of the present disclosure will be described based on the following figures, wherein.

DESCRIPTION OF EMBODIMENTS

An embodiment of the present disclosure will now be described with reference to the drawings. A shape and a material described below are exemplary for the purpose of explanation, and may be suitably changed according to a specification of a coil wiring with a coating to which a method of removing a coating layer of a coil wiring is applied. In the following, similar elements throughout all drawings are assigned the same reference numerals for explanation. In addition, in the description of the present document, reference numerals used in preceding description may be referred to as necessary.

Figure 1A:
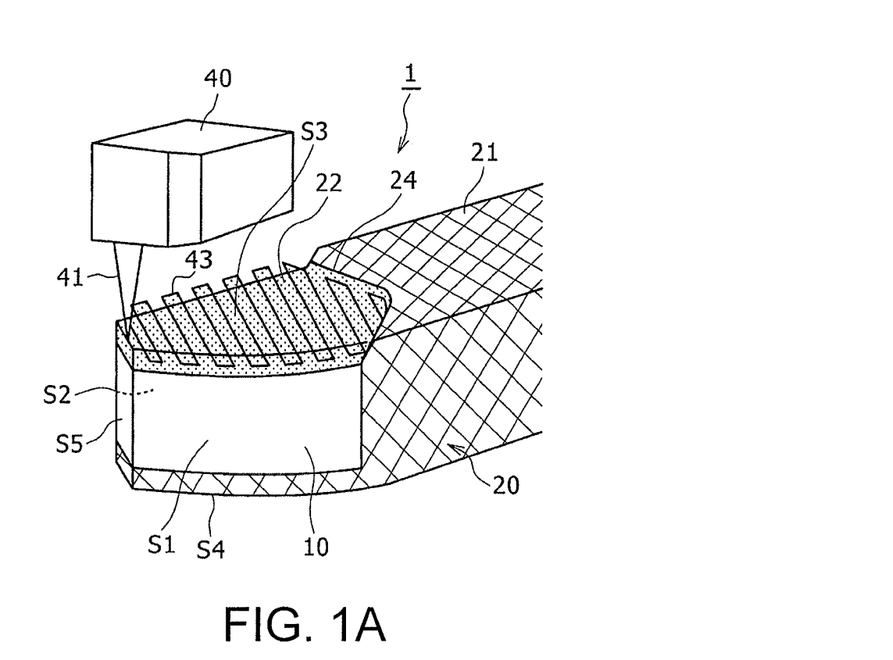
FIG. 1A is a diagram showing a method of removing a coating layer of a coil wiring according to an embodiment of the present disclosure, and showing a state in which laser is irradiated onto an insulating coating layer which is in close contact with the coil wiring.
Figure 1B:
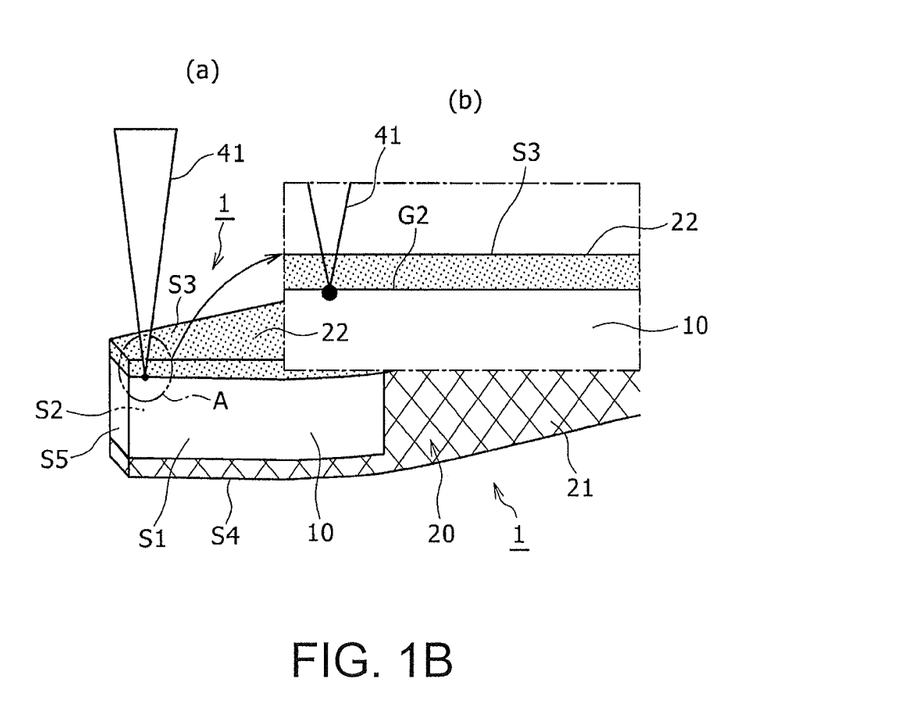
FIG. 1B shows in (a) a diagram in which a laser marker machine and a movement trajectory of laser light are omitted from FIG. 1A and in (b) an A part enlarged view of (a)

FIG. 1A shows a method of removing a coating layer of a coil wiring according to the present embodiment, and shows laser irradiation for removing an insulating coating layer 20 which is in close contact with a coil wiring 10. FIG. 1B shows in (a) a structure of FIG. 1A with a laser marker machine and a movement trajectory of laser light omitted, and in (b) an A part enlarged view of (a) of FIG. 1B.

A coil wiring 1 with a coating to which the method of removing the coating layer is applied is used, for example, for forming a stator coil of an electric motor or a power generator. In the coil wiring 1 with the coating, the insulating coating layer 20 is in close contact with an outer circumferential surface of the coil wiring 10 which is a conductor wire. The coil wiring 10 is, for example, a copper wiring. The insulating coating layer 20 is formed, for example, including a resin such as polyimide. In FIGS. 1A and 1B, one end of the coil wiring 1 with the coating is shown. Of five surfaces S1, S2, S3, S4, and S5 of one end of the coil wiring 1 with the coating, on the first surface S1 and the second surface S2 which are at opposite sides from each other, and on a fifth surface S5, a cutting machining is applied in advance, to cut off a part of the insulating coating layer 20 and the coil wiring 10. With this structure, one end of the coil wiring 1 with the coating is formed in a tapered shape in which a spacing between the first surface S1 and the second surface S2 is reduced toward one end (left end of FIG. 1A and of (a) of FIG. 1B). In FIGS. 1A and 1B, the insulating coating layer 20 is shown by a slanted lattice portion and a sand-like portion, and the coil wiring 10 is shown by a plain portion. Of the insulating coating layer 20, the slanted lattice portion shows a remain-planned portion 21 from which the coating layer is not to be removed, and the sand-like portion shows a removal-planned portion 22 from which the coating layer is to be removed. The coil wiring 10 is a flat-type wire having a quadrangular cross section. In order to enable connection of another conductor to the one end of the coil wiring 1 with the coating, on the ends of the coil wiring 1 with the coating, the insulating coating layer 20 of a part of the outer circumferential surface is removed. For this purpose, the following method of removing the coating layer is employed. In the following, a case will be described in which the removal-planned portion 22 of the insulating layer 20 is removed from the one end of the coil wiring 10 with the coating.

The removal-planned portion 22 of the insulating coating layer 20 is located on the third surface S3, and the remain-planned portion 21 of the insulating coating layer 20 is located on the fourth surface S4. In the present embodiment, the remain-planned portion 21 is set to remain on one end in a width direction (lower end of FIGS. 1A and 1B) at an opposite side of the removal-planned portion 22 of the coil wiring 1 with the coating, but alternatively, this portion may be removed similar to the removal-planned portion 22.

Using the method of removing the coating layer, the insulating coating layer 20 which is in close contact with the third surface S3 is removed. For the method of removing the coating layer, a laser marker machine 40 is used, and laser light 41 emitted from the laser marker machine 40 is irradiated onto the third surface S3.

Figure 2:
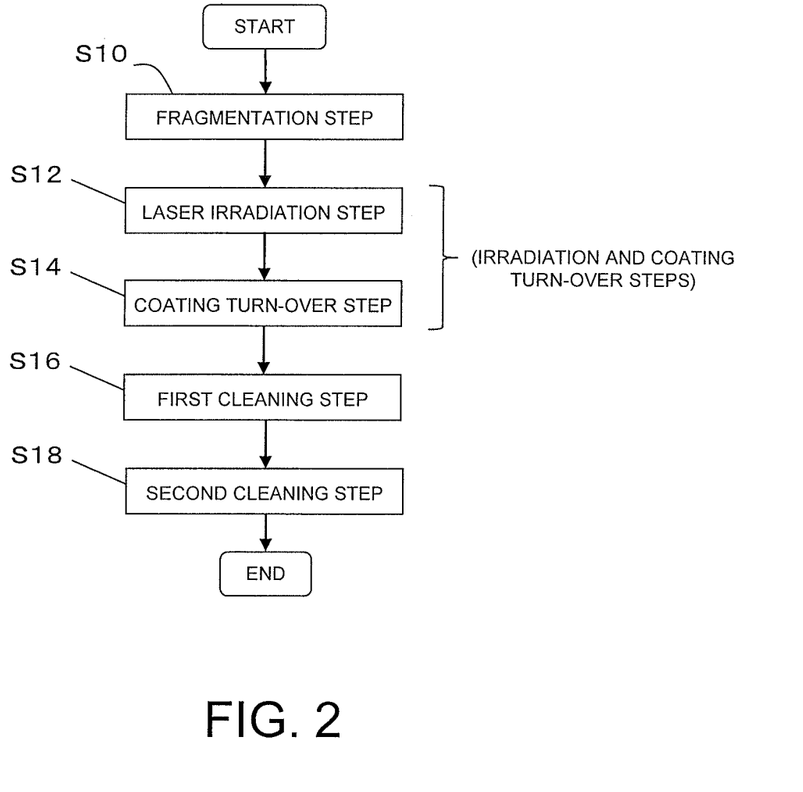
FIG. 2 is a flowchart showing a method of removing a coating layer of a coil wiring.
Figure 3:
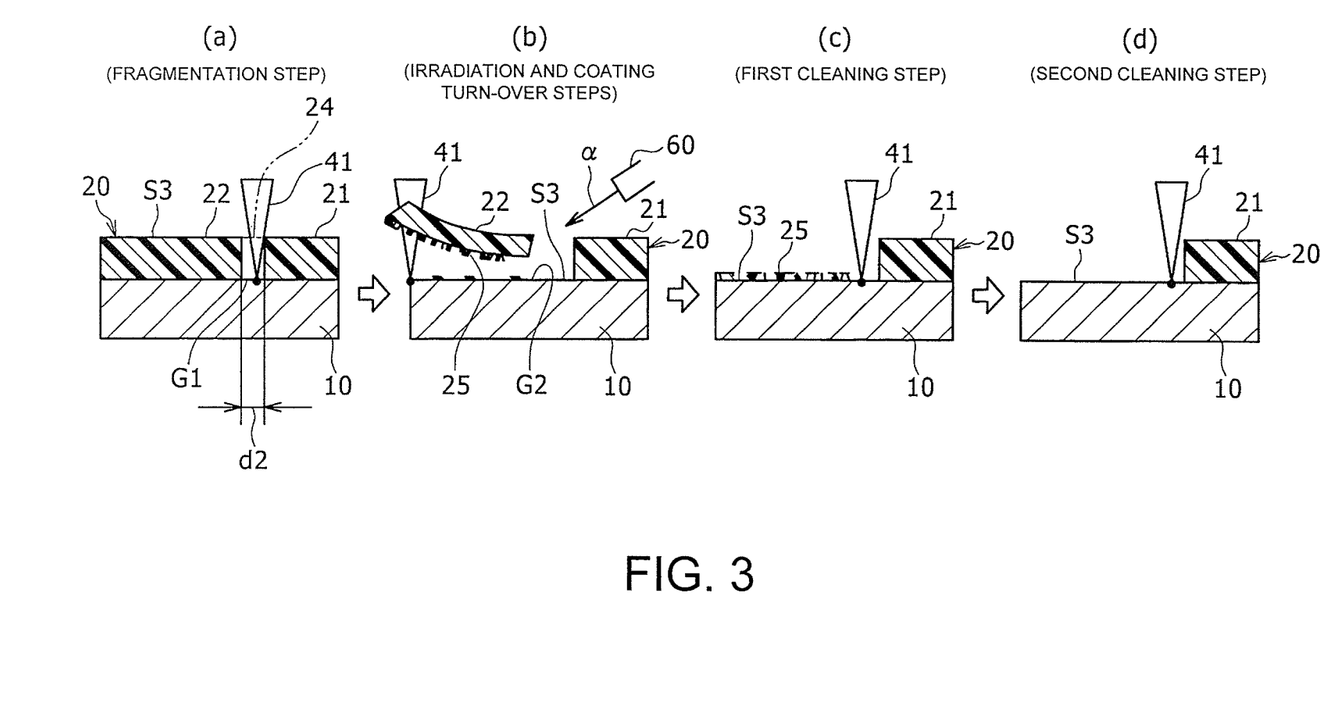
FIG. 3 is a diagram showing a method of removing a coating layer of a coil wiring in a sequence of steps.

FIG. 2 is a flowchart showing the method of removing the coating layer of the coil wiring 10. FIG. 3 shows the method of removing the coating layer in a sequence of the steps. The method of removing the coating layer includes a fragmentation step (S10), irradiation and coating turn-over steps (S12 and S14), a first cleaning step (S16), and a second clearing step (S18).

In the fragmentation step shown in (a) of FIG. 3, a line-shaped region 24 of the insulating coating layer 20, which separates the removal-planned portion 22 and the remain-planned portion 21 of the insulating coating layer 20 on the third surface S3, is removed by carbonization and sublimation by laser irradiation. The fragmentation step corresponds to a first laser irradiation step.

Figure 4:
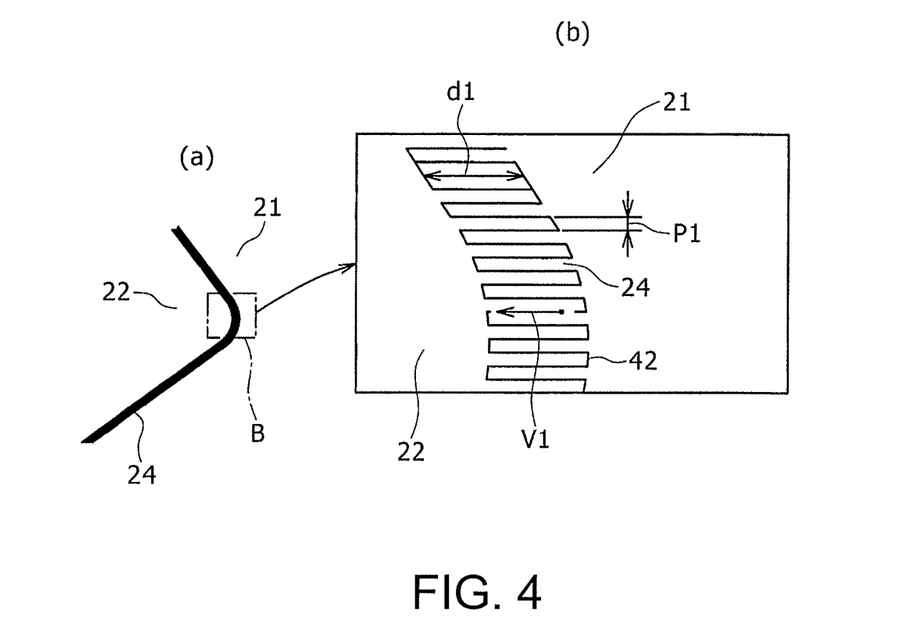
FIG. 4 shows in (a) a line-shaped region of an insulating coating layer which is removed in a fragmentation step, and in (b) a diagram showing a movement trajectory of laser light in a B part enlarged view of (a)

FIG. 4 shows in (a) the line-shaped region 24 to be removed in the fragmentation step, and in (b) a movement trajectory 42 of the laser light 41 in a B part enlarged view of (a). As shown by the movement trajectory 42 in (b) of FIG. 4, an irradiation portion of the laser light 41 is moved in a square-wave shape to pass the entirety in the line-shaped region 24. As the laser light 41, a pulse laser is used.

Figure 5:
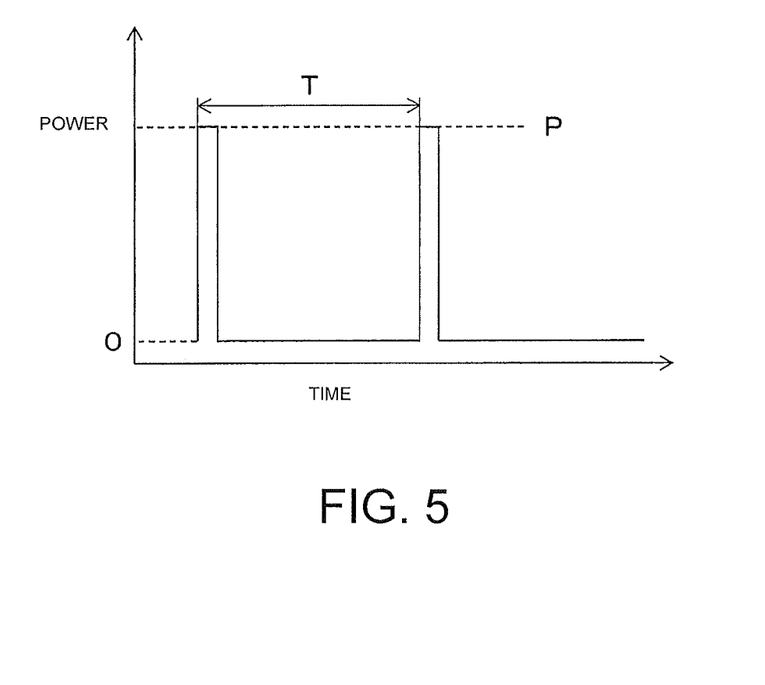
FIG. 5 is a diagram showing a power waveform of laser light.

FIG. 5 shows a power waveform of the laser light 41. The laser light 41 generates a pulse power P of a step shape at a very short period T in the laser marker machine 40, to thereby irradiate a laser spot on the irradiation portion in a periodic pulse form. Because the period T is very short, as shown in (b) of FIG. 4, the movement trajectory 42 is in a form of a continuous solid line.

An amplitude d1 ((b) of FIG. 4) of the movement trajectory 42 is approximately coincided with a width d2 ((a) of FIG. 3) of the line-shaped region 24. As the wavelength of the laser light 41, a fundamental wavelength such as approximately 1064 nm is used, in steps including the laser irradiation step in the irradiation and coating turn-over steps, the first cleaning step, and the second cleaning step, to be described later. The laser light 41 of the fundamental wavelength transmits through the insulating coating layer 20, but is absorbed by the coil wiring 10. The laser light 41 is irradiated from the side of the outer surface of the line-shaped region 24 toward a boundary G1 ((a) of FIG. 3) of the coil wiring 10 with the insulating coating layer 20, to carbonize and remove by sublimation the boundary portion between the insulating coating layer 20 and the coil wiring 10 of the line-shaped region 24 by generation of heat of the coil wiring 10. Thus, the line-shaped region 24 is carbonized from the boundary portion toward the outer surface side. By appropriately restricting a scanning velocity V1 ((b) of FIG. 4) of the laser light 41, all of the line-shaped region 24, including the outer surface of the line-shaped region 24 in addition to the boundary portion with the coil portion 10, is carbonized and sublimed, and the entirety of the line-shaped region 24 is removed. When the scanning velocity V1 is too high, an amount of incidence of laser per unit time in the irradiation portion is decreased, and only the boundary portion with the coil wiring 10, and not the entirety, of the line-shaped region 24 is carbonized. Thus, in the fragmentation step, unlike the laser irradiation step to be described later, the scanning velocity V1 is restricted to a low velocity.

In the irradiation and coating turn-over steps shown in (b) of FIG. 3, the removal-planned portion 22 of the third surface S3 is removed by irradiation of the laser light 41 and blowing of air. Specifically, as shown in FIG. 2, the irradiation and coating turn-over steps include a laser irradiation step corresponding to a second laser irradiation step (S12), and a coating turn-over step (S14). In the laser irradiation step, the laser light 41 of the fundamental wavelength is irradiated from the outer surface side of the removal-planned portion 22 toward a boundary G2 ((b) of FIG. 3) of the coil wiring 10 with the insulating coating layer 20, to carbonize the boundary portion between the insulating coating layer 20 and the coil wiring 10 of the removal-planned portion 22 by generation of heat of the coil wiring 10. In the coating turn-over step, air is blown onto the removal-planned portion 22, to turn over and blow off the removal-planned portion 22. In (b) of FIG. 3, a direction of application of blow of air from an air blower 60 is shown by an arrow α. In the following, a case will be described in which the laser irradiation step and the blowing of the air onto the removal-planned portion 22 in the coating turn-over step are executed simultaneously.

Figure 6:
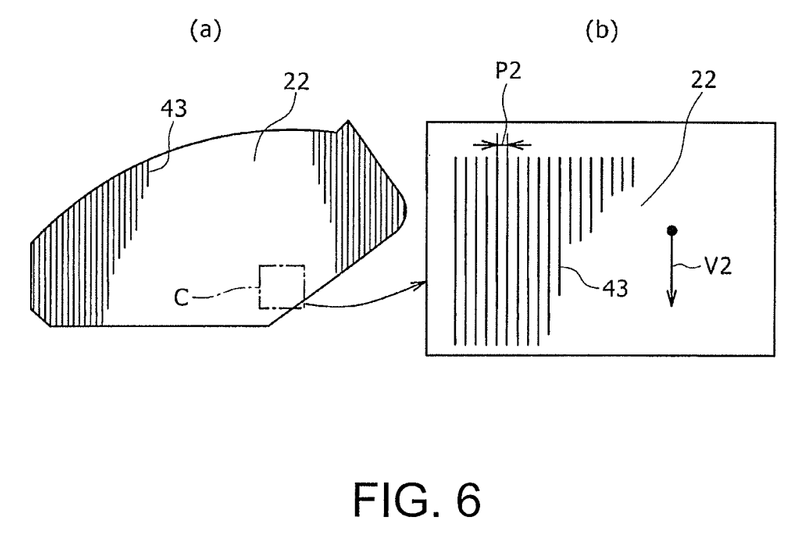
FIG. 6 shows in (a) a movement trajectory of laser light at a removal-planned portion in a laser irradiation step, and in (b) a C part enlarged view of (a)

FIG. 6 shows in (a) a movement trajectory 43 of the laser light 41 at the removal-planned portion 22 in the laser irradiation step, and in (b) a C part enlarged view of (a). In the laser irradiation step, the laser light 41 is irradiated from the outer surface side of the removal-planned portion 22 toward the boundary G2 ((b) in FIG. 3) of the coil wiring 10 with the removal-planned portion 22, to carbonize the boundary portion with the coil wiring 10 of the removal-planned portion 22, but the carbonization does not extend to the outer surface of the removal-planned portion 22. With such a process, a carbide 25 ((b) of FIG. 3) is formed at the boundary portion of the removal-planned portion 22 with the coil wiring 10. In order to carbonize the boundary portion, as shown in FIG. 1A, the irradiation portion is moved in the movement trajectory 43 of the square wave shape so that the laser light 41 uniformly passes the outer surface of the removal-planned portion 22. In this process, as shown in (a) of FIG. 6, on the removal-planned portion 22, of the movement trajectory 43 of the laser light 41, only a parallel line portion other than a vertex portion and a valley portion is used. A pulse power P and a pulse period T of the laser light 41 used in the laser irradiation step are similar to those of the laser light 41 used in the fragmentation step.

A scanning velocity V2 ((b) of FIG. 6) of the laser light 41 used in the laser irradiation step is set higher than the scanning velocity V1 ((b) of FIG. 4) of the laser light 41 used in the fragmentation step. As the scanning velocity of the laser light 41 is reduced, the amount of incidence of laser per unit time in the irradiation portion is increased, and the removal performance of the insulating coating layer is thus increased, but the machining time is correspondingly increased. Thus, in the fragmentation step, in order to increase a fragmentation characteristic for the insulating coating layer 20, the scanning velocity V1 is set low. In the laser irradiation step, on the other hand, the scanning velocity V2 is set higher than the scanning velocity V1 so that the machining time can be shortened.

In addition, a pitch P2 which is a spacing of parallel lines of the movement trajectory 43 of the laser light 41 is set larger than a pitch P1 ((b) of FIG. 4) of the movement trajectory 42 ((b) of FIG. 4) in the fragmentation step. As the pitch of the movement trajectory is reduced, the amount of incidence of laser per unit time in the irradiation portion is increased, and the removal performance of the insulating coating layer is increased, but the machining time is correspondingly elongated. Thus, in the fragmentation step, the pitch P1 is set small in order to improve the fragmentation characteristic for the insulating coating layer 20, but, in the laser irradiation step, the pitch P2 is set larger than the pitch P1, so that the machining time can be shortened. As a result, a work time of the laser irradiation step can be shortened in comparison to a case where the scanning velocity V2 is set lower than or equal to the scanning velocity V1, and the pitch P2 is set to be smaller than or equal to the pitch P1. In addition, a configuration is employed in which, in the removal-planned portion 22, the boundary portion between the insulating coating layer 20 and the coil wiring 10 is carbonized by the generation of heat of the coil wiring 10, but the carbonization does not extend to the outer surface of the removal-planned portion 22.

Figure 7:
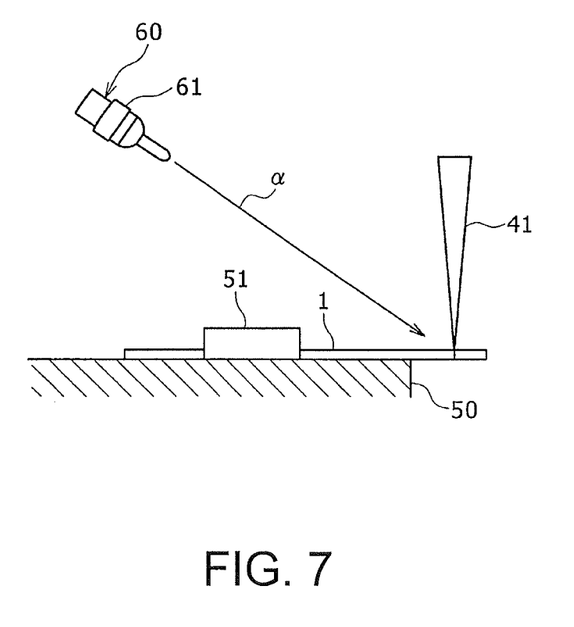
FIG. 7 is a diagram showing a coating turn-over step and showing a state in which air is blown onto one end of a coil wiring with a coating from an air blower.

FIG. 7 shows the coating turn-over step, and shows a state in which air is blown from the air blower 60 onto one end of the coil wiring 1 with the coating. The air blower 60 sucks in air from an intake port by driving of a fan place on a casing (not shown), and ejects air from an air ejector 61. The air ejector 61 is placed at an upper side of the coil wiring 1 with the coating which is fixed on a base 50 by a coil holding jig 51, and in an orientation facing a slanted lower side, toward the one end of the coil wiring with the coating. The air is ejected from the air ejector 61 in the direction of an arrow α of FIG. 7, to blow air onto the removal-planned portion 22 of the one end of the coil wiring 1 with the coating. With this process, as shown in (b) of FIG. 3, the removal-planned portion 22 is turned over and blown off. In the present embodiment, the irradiation of the laser 41 from the outer surface side of the removal-planned portion 22 in the laser irradiation step and the blowing of the air onto the removal-planned portion 22 in the coating turn-over step are executed simultaneously. Because of this, when the boundary portion of the removal-planned portion 22 with the coil wiring 10 is carbonized by the generation of heat of the coil wiring 10 from a side end of the line-shaped region (right end in (b) of FIG. 3) to one end of the coil wiring 10 (left end in (b) of FIG. 3) by the irradiation of the laser light 41, the removal-planned portion 22 is turned over and blown off by the blowing of the air.

Because the boundary portion between the insulating coating layer 20 of the removal-planned portion 22 and the coil wiring 10 is carbonized by the laser irradiation in the laser irradiation step, the degree of close contact of the boundary portion with respect to the coil wiring 10 can be reduced. Because the air is blown onto the removal-planned portion 22 to turn over and blow off the removal-planned portion 22 in the coating turn-over step, the removal-planned portion 22 can be removed without requiring carbonizing all (all volume) of the removal-planned portion 22 with the laser irradiation. For example, as the carbonization of the removal-planned portion 22, it may be the case that only the boundary portion of the removal-planned portion 22 with the coil wiring 10 is carbonized. With this configuration, the laser irradiation time in the coating removal work can be shortened. In addition, because the irradiation of the laser light from the outer surface side of the removal-planned portion 22 in the laser irradiation step and the blowing of the air onto the removal-planned portion 22 in the coating turn-over step are executed simultaneously, the work time of the coating removal work can be further shortened.

Next, S16 of FIG. 2; that is, the first cleaning step shown in (c) of FIG. 3, is executed. In the first cleaning step, the carbide 25 ((c) of FIG. 3) of the insulating coating layer 20 adhered to and remaining on a removal trace of the removal-planned portion 22 on the coil wiring 1 with the coating is removed. For this purpose, in the first cleaning step, laser light is irradiated to an entirety of the removal trace by the laser marker machine 40, and, similar to the laser irradiation step of S12 of FIG. 2, the irradiation portion is moved in a movement trajectory of a quadrangular wave shape. In this process, a scanning velocity of the laser light 41 is set even higher than the scanning velocity V2 in the laser irradiation step. In addition, the pitch in the movement trajectory of the laser light 41 is set even larger than the pitch P2 in the laser irradiation step. With this configuration, the work time of the first cleaning step can be set shorter than the work time of the laser irradiation step. In the first cleaning step, the pulse power P and the pulse period T of the laser light 41 are similar to those in the cases of the fragmentation step and the laser irradiation step. Because the irradiation and coating turn-over steps are executed before the first cleaning step, at a starting stage of the first cleaning step, there is no film-form insulating coating layer 20 in the removal trace on the coil wiring 10. Thus, the laser light 41 can be absorbed even more by the coil wiring 10, and removal of the carbide 25 by the generation of heat of the coil wiring 10 can be made easier.

Finally, S18 of FIG. 2; that is, the second cleaning step shown in (d) of FIG. 3, is executed. A structure of the second cleaning step is similar to that of the first cleaning step. By executing the cleaning steps twice, the carbide 25 ((c) of FIG. 3) in the removal trace of the removal-planned portion 22 in the coil wiring 1 with the coating can be removed cleanly. With this process, a newly produced surface from which the carbide 25 is cleanly removed is exposed at the third surface S3 of the one end of the coil wiring 1 with the coating, and thus, superior conductivity can be secured when the coil wiring is welded with an exposed portion of a coil wiring in another coil wiring with a coating at the newly produced surface. Alternatively, when the carbide in the removal trace can be cleanly removed by one-time cleaning of the first cleaning step, the second cleaning step may be omitted.

Figure 8:
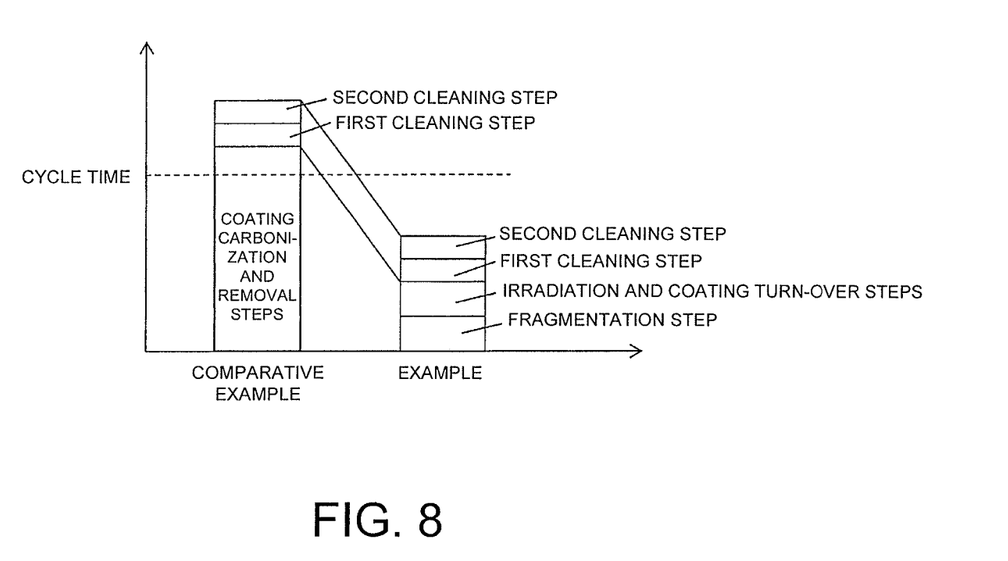
FIG. 8 is a diagram showing a comparison between an Example and a Comparative Example for a cycle time which is a time of a coating removal work for a single product of a coil wiring with a coating.

FIG. 8 shows a comparison of cycle time between an Example and a Comparative Example, which is a time of coating removal work for a single product of the coil wiring 1 with the coating. In the Example, the insulating coating layer 20 on the third surface S3 of one end of the coil wiring 1 with the coating (removal-planned portion 22) is removed using the method of removing the coating according to the embodiment. On the other hand, in the Comparative Example, after coating carbonization and removal steps are executed, first and second cleaning steps are executed. In the "coating carbonization and removal steps", all volumes of the removal-planned portion 22 of the insulating coating layer 20 on the third surface S3 of one end of the coil wiring 1 with the coating are carbonized and removed by sublimation by irradiation of laser light. The first and second cleaning steps in the Comparative Example are similar to those of the embodiment described above. As can be understood from the result of comparison of FIG. 8, in the Example, the times required for the irradiation and coating turn-over steps and in the fragmentation step can be significantly shortened as compared to the times required for the coating carbonization and removal steps of the Comparative Example, and thus, the cycle time can be significantly shortened.

Further, according to the embodiment, a time of the coating removal work of one end of the coil wiring 1 with the coating using one laser marker machine 40 can be shortened. Thus, when the coating removal work of respective ends of a plurality of coil wirings 1 with the coatings is to be executed using one or a plurality of laser marker machines 40, the coatings at a large number of locations can be removed by one laser marker machine 40 while achieving a target time for the work as a whole. Because of this, the number of laser marker machines necessary for removal of the coatings at all locations for achieving the target time can be reduced, and, consequently, a facility cost can be reduced.

Figure 9:
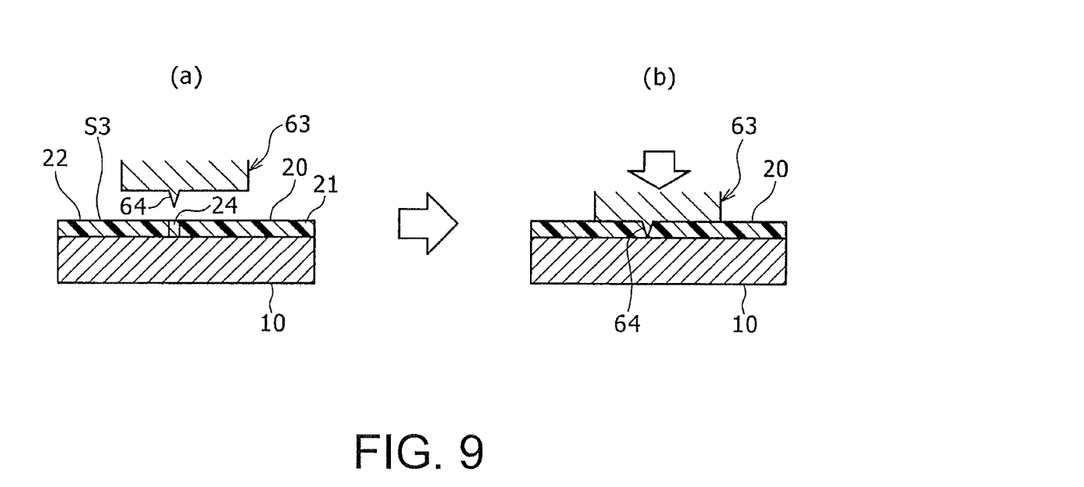
FIG. 9 is a diagram showing a method of removing a line-shaped region of an insulating coating layer in a fragmentation step in an alternative configuration of an embodiment of the present disclosure.

FIG. 9 shows a method of removing the line-shaped region 24 of the insulating coating layer 20 in the fragmentation step, in an alternative configuration of the embodiment of the present disclosure. In the present configuration, as shown in (a) of FIG. 9, a cutter tool 63 is placed at an upper side of the line-shaped region 24 on the third surface S3 of one end of the coil wiring 10. The cutter tool 63 has a pointed protrusion 64 at a lower end. As shown in (b) of FIG. 9, the cutter tool 63 is lowered and the protrusion 64 is pressed onto the line-shaped region 24, to remove the line-shaped region 24. Then, using the laser marker machine, similar to the structure of FIGS. 1A-7, the irradiation and coating turn-over steps, and the first and second cleaning steps are executed, to remove the removal-planned portion 22. According to this structure, the line-shaped region 24 can be removed without using the laser marker machine.

Although not shown in the drawings, as an alternative configuration of the embodiment, there may be employed a configuration in which, when the line-shaped region of the insulating coating layer is to be removed by irradiation of the laser light in the fragmentation step similar to the structure of FIGS. 1A-7, a short-wavelength laser (green laser) having a shorter wavelength than the fundamental wavelength laser of the structure of FIGS. 1A-7 may be used as the laser light. The short-wavelength laser has, for example, a wavelength of 532 nm. Because the short-wavelength laser has a higher absorption rate by the insulating coating layer 20 than the fundamental wavelength laser, in the fragmentation step using the short-wavelength laser, the laser light is absorbed by the line-shaped region, and the line-shaped region is shaved from the outside by generation of heat thereof. The scanning velocity, the pitch of the movement trajectory, the pulse power, and the pulse period for the short-wavelength laser are similar to those used in the fragmentation step of the structure of FIGS. 1A-7. The other structures of the alternative configuration are similar to those of the structure of FIGS. 1A-7. For example, in the laser irradiation step and in the first and second cleaning steps, the laser light of the fundamental wavelength is used. When such a short-wavelength laser is used, because the line-shaped region is directly machined without using the generation of heat of the coil wiring, a removal characteristic for the line-shaped region can be improved. Further, for the short-wavelength laser, a beam size of the laser light can be reduced and a direct machining can be enabled. Thus, the line-shaped region can be removed with high precision. With this configuration, influence of heat of the laser light to the remain-planned portion of the insulating coating layer adjacent the line-shaped region can be suppressed. Thus, the insulating performance of the remain-planned portion can be maintained.

In the above description, a case is described in which the laser irradiation step and the blowing of the air onto the removal-planned portion in the coating turn-over step are executed simultaneously, but alternatively, the laser irradiation step and the coating turn-over step may be completely separated temporally. In this case, the blowing of the air onto the removal-planned portion in the coating turn-over step is started after the laser irradiation step. In this case also, similar to the above-described configurations, the removal-planned portion can be removed without the necessity for carbonizing all of the removal-planned portion by the laser irradiation, and the laser irradiation time in the coating removal work can be consequently shortened.

The invention claimed is:

1. A method of removing an insulating coating layer which is in close contact with a coil wiring, comprising:
a fragmentation step of removing a line-shaped region of the insulating coating layer, the line-shaped region separates a removal-planned portion and a remain-planned portion of the insulating coating layer;
a laser irradiation step of irradiating laser light which transmits through the insulating coating layer but which is absorbed by the coil wiring, from a side of an outer surface of the removal-planned portion toward a boundary of the coil wiring with the insulating coating layer, to carbonize a boundary portion between the insulating coating layer and the coil wiring of the removal-planned portion by generation of heat of the coil wiring; and a coating turn-over step of blowing air onto the removal-planned portion to turn over and blow off the removal-planned portion.

2. The method of removing the coating layer of the coil wiring according to claim 1, wherein in the fragmentation step, the line-shaped region of the insulating coating layer is removed by laser light irradiation, and a scanning velocity of the laser light used in the laser irradiation step is set higher than a scanning velocity of the laser light used in the fragmentation step.

3. The method of removing the coating layer of the coil wiring according to claim 2, wherein a spacing of parallel lines of a movement trajectory of the laser light in the laser irradiation step is set larger than a spacing of parallel lines of a movement trajectory of the laser light in the fragmentation step.

4. The method of removing the coating layer of the coil wiring according to claim 1, wherein in the fragmentation step, the line-shaped region of the insulating coating layer is removed by laser light irradiation, and a spacing of parallel lines of a movement trajectory of the laser light in the laser irradiation step is set larger than a spacing of parallel lines of a movement trajectory of the laser light in the fragmentation step.

5. The method of removing the coating layer of the coil wiring according to claim 1, wherein the laser irradiation step and the blowing of air onto the removal-planned portion in the coating turn-over step are executed simultaneously.

6. The method of removing the coating layer of the coil wiring according to claim 1, wherein in the fragmentation step, the line-shaped region of the insulating coating layer is removed by a short-wavelength laser irradiating laser light, which has a shorter wavelength than a fundamental-wavelength laser used in the laser irradiation step and which is absorbed by the line-shaped region.

* * * * *